United States Patent
Nakane et al.

(10) Patent No.: US 9,035,401 B2
(45) Date of Patent: May 19, 2015

(54) PHYSICAL QUANTITY DETECTION DEVICE AND PHYSICAL QUANTITY DETECTOR

(71) Applicants: Taketomo Nakane, Tokyo (JP); Yoshihiro Haseko, Tokyo (JP); Yuki Shimazu, Tokyo (JP)

(72) Inventors: Taketomo Nakane, Tokyo (JP); Yoshihiro Haseko, Tokyo (JP); Yuki Shimazu, Tokyo (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 14/247,349

(22) Filed: Apr. 8, 2014

(65) Prior Publication Data

US 2014/0319628 A1  Oct. 30, 2014

(30) Foreign Application Priority Data

Apr. 25, 2013  (JP) .................................. 2013-092363

(51) Int. Cl.
- *H01L 23/10* (2006.01)
- *G01L 9/00* (2006.01)
- *H01L 23/31* (2006.01)
- *H01L 29/84* (2006.01)
- *H01L 23/00* (2006.01)

(52) U.S. Cl.
CPC .............. *H01L 23/10* (2013.01); *G01L 9/0042* (2013.01); *H01L 29/84* (2013.01); *H01L 2224/48091* (2013.01); *H01L 2224/73265* (2013.01); *H01L 23/3121* (2013.01); *H01L 23/564* (2013.01)

(58) Field of Classification Search
CPC ... H01L 23/10; H01L 23/3121; H01L 23/564; G01L 9/0042
See application file for complete search history.

(56) References Cited

U.S. PATENT DOCUMENTS

| | | | |
|---|---|---|---|
| 5,011,637 A * | 4/1991 | Overman et al. | 264/41 |
| 5,352,352 A * | 10/1994 | Tsukada et al. | 204/415 |
| 5,691,794 A * | 11/1997 | Hoshi et al. | 349/158 |
| 7,087,134 B2 * | 8/2006 | Chen et al. | 156/281 |
| 7,959,865 B2 * | 6/2011 | Schmidt et al. | 422/89 |
| 8,679,831 B2 * | 3/2014 | Handique et al. | 435/325 |
| 2009/0008728 A1 * | 1/2009 | Fujii et al. | 257/415 |
| 2009/0050990 A1 * | 2/2009 | Aono et al. | 257/415 |
| 2011/0042767 A1 * | 2/2011 | Findlay et al. | 257/432 |
| 2012/0000288 A1 * | 1/2012 | Matsuura et al. | 73/579 |

FOREIGN PATENT DOCUMENTS

| | | |
|---|---|---|
| JP | 02-272339 | 11/1990 |
| JP | 06-076938 | 9/1994 |
| JP | 2000-241274 | 9/2000 |

* cited by examiner

*Primary Examiner* — William Coleman
(74) *Attorney, Agent, or Firm* — IPUSA, PLLC (57) ABSTRACT

A physical quantity detection device includes a glass substrate, a substrate including a physical quantity detection part and bonded to a first surface of the glass substrate with a hermetically sealed space being formed inside the substrate, and a function membrane formed on a second surface of the glass substrate opposite to the first surface. The function membrane prevents the second surface of the glass substrate from coming into contact with moisture in the atmosphere.

16 Claims, 10 Drawing Sheets

PHYSICAL QUANTITY DETECTION DEVICE AND PHYSICAL QUANTITY DETECTOR

CROSS-REFERENCE TO RELATED APPLICATION

This application is based upon and claims the benefit of priority of Japanese Patent Application No. 2013-092363, filed on Apr. 25, 2013, the entire contents of which are incorporated herein by reference.

BACKGROUND OF THE INVENTION

1. Field of the Invention

The present invention relates to physical quantity detection devices and physical quantity detectors.

2. Description of the Related Art

Gauge pressure sensors having a silicon substrate including a diaphragm joined to an upper surface of a glass substrate have been known. In such gauge pressure sensors, a through hole for communicating the pressure of a medium to be measured is provided in the glass substrate. Furthermore, a metal film for soldering a gauge pressure sensor to a metal base is formed on a lower surface (bottom surface) of the glass substrate. It has been shown that the metal film for soldering preferably has a layered structure of different kinds of films, which is less likely to be degraded by sodium ions included in the glass substrate. (See, for example, Japanese Laid-Open Patent Applications No. 2000-241274 and No. 2-272339 and Japanese Laid-Open Examined Patent Application No. 6-76938.)

On the other hand, apart from the above-described gauge pressure sensors, absolute pressure sensors are known that use a physical quantity detection device in which a space hermetically sealed by a glass substrate and a silicon substrate including a diaphragm is formed by joining the silicon substrate to an upper surface of the glass substrate. For example, a Wheatstone bridge circuit using four piezoresistive elements whose resistance values change depending on an applied pressure is formed on the diaphragm.

In such absolute pressure sensors, a lower surface (bottom surface) of the glass substrate of the physical quantity detection device is fixed onto a substrate by an adhesive agent. The thickness of the silicon substrate is, for example, approximately 1 mm, the thickness of the glass substrate is, for example, approximately 1 mm, and the total thickness of the physical quantity detection device is, for example, approximately 2 mm.

SUMMARY OF THE INVENTION

According to an aspect of the present invention, a physical quantity detection device includes a glass substrate, a substrate including a physical quantity detection part and bonded to a first surface of the glass substrate with a hermetically sealed space being formed inside the substrate, and a function membrane formed on a second surface of the glass substrate opposite to the first surface. The function membrane prevents the second surface of the glass substrate from coming into contact with moisture in the atmosphere.

According to an aspect of the present invention, a physical quantity detection device includes a first glass substrate and a second glass substrate, wherein at least one of the first and second glass substrates includes a cavity, a substrate including a physical quantity detection part, the substrate being bonded to and provided between the first and second glass substrates with a hermetically sealed space formed around the physical quantity detection part, and a first function membrane and a second function membrane formed on a surface of the first glass substrate facing away from the substrate and a surface of the second glass substrate facing away from the substrate, respectively, wherein the first and second function membranes preventing the surfaces of the first and second glass substrates from coming into contact with moisture in an atmosphere.

According to an aspect of the present invention, a physical quantity detector includes any of the physical quantity detection devices as set forth above.

The object and advantages of the invention will be realized and attained by means of the elements and combinations particularly pointed out in the claims.

It is to be understood that both the foregoing general description and the following detailed description are exemplary and explanatory and not restrictive of the invention.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

Consideration has been given to providing such absolute pressure sensors as described above in small apparatuses such as cellular phones. Therefore, there has been a demand for small and low-profile absolute pressure sensors. Accordingly, absolute pressure sensors are desired to be significantly reduced in the thickness of the silicon substrate and the thickness of the glass substrate.

The inventors of the present invention, however, have found that when the thickness of the glass substrate is less than a predetermined value, a variation in the output of the physical quantity detection device (a variation in the output of the Wheatstone bridge circuit) under predetermined conditions increases as the thickness of the glass substrate decreases.

According to an aspect of the present invention, a physical quantity detection device that reduces output variations irrespective of the thickness of a glass substrate is provided.

A description is given, with reference to the accompanying drawings, of embodiments of the present invention. In the drawings, the same element is referred to by the same reference numeral, and a description of the same element may not be repeated.

First Embodiment

Figure 1:
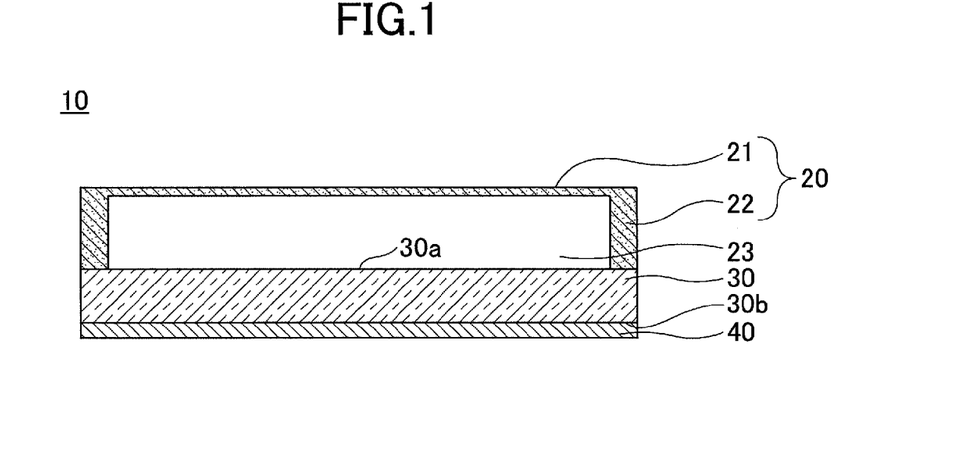
FIG. 1 is a cross-sectional view of a physical quantity detection device according to a first embodiment.

FIG. 1 is a cross-sectional view of a physical quantity detection device according to a first embodiment. Referring to FIG. 1, a physical quantity detection device 10 according to the first embodiment includes a diaphragm part 20, a glass substrate 30, and a function membrane 40. The physical quantity detection device 10 may be provided in, for example, absolute pressure sensors.

The diaphragm part 20 (a pressure-sensitive diaphragm part) form a sensor surface of the physical quantity detection device 10. The diaphragm part 20 detects a stress generated by a pressure by converting the stress into an electrical signal. The diaphragm part 20 includes a diaphragm surface 21 and a diaphragm support part 22. The diaphragm part 20 is an example of a physical quantity detection part, and the physical quantity may be other than a pressure.

The diaphragm surface 21 includes a surface where a pressure is detected. The diaphragm surface 21 is formed into a thin film shape. The diaphragm surface 21 is configured to detect a pressure applied to the diaphragm surface 21 by the deflection of the diaphragm surface 21 caused by the applied pressure. Furthermore, the diaphragm support part 22 supports the diaphragm surface 21.

The diaphragm part 20 is formed in, for example, a silicon (Si) substrate. In the following description, the silicon substrate refers to a substrate whose principal component is silicon. Examples of the silicon substrate include a silicon-on-insulator (SOI) substrate. In the case of using an SOI substrate as the diaphragm part 20, the diaphragm surface 21 may be formed with a silicon active layer and the diaphragm support part 22 may be formed with a buried oxide and a silicon substrate on the bottom side.

The glass substrate 30 is a support member that supports the diaphragm part 20. For example, a bottom surface of the diaphragm support part 22 of the diaphragm part 20 is fixed to an outer edge portion of a first surface 30a (a top surface in FIG. 1) of the glass substrate 30 by anodic bonding. A multilayer glass substrate may be used as the glass substrate 30.

The diaphragm part 20 is bonded to the first surface 30a of the glass substrate 30, so that a cavity part 23, which is a hermetically sealed space, is formed. In the case of providing the physical quantity detection device 10 in an absolute pressure sensor, the cavity part 23 serves as a vacuum reference chamber maintained in a vacuum state.

The function membrane 40 is formed so as to cover a second surface 30b (a bottom surface on the side opposite to the first surface 30b in FIG. 1) of the glass substrate 30. In general, the term "function membrane" refers to a thin film having a predetermined function. In embodiments of the present invention, the predetermined function is a function to prevent the second surface 30b of the glass substrate 30 from coming into contact with moisture in the atmosphere. That is, the function membrane 40 prevents alkali metal ions (such as $Na^+$ and $K^+$) included in the glass substrate 30 from coming into contact with moisture in the atmosphere. The material of the function membrane 40 may be selected from those having a disposition to repel moisture and also a disposition to prevent the migration of alkali metal ions (such as $Na^+$ and $K^+$).

Examples of the function membrane 40 having these dispositions include inorganic films such as metal films, silicon nitride films (SiN films), and diamond-like carbon (DLC) films and organic films of special polyurethane, fluorocarbon polymers, acrylonitrile butadiene styrene (ABS) polymers, and polystyrene.

Examples of metal films usable as the function membrane 40 include a titanium (Ti) film of approximately 100 nm in thickness and a gold (Au) film of approximately 150 nm in thickness. The Ti film and the Au film may be deposited by, for example, sputtering. In the case of depositing a Au film, for example, a titanium tungsten (TiW) film of approximately 35 nm in thickness may be used as an underlayer. The specific meaning of forming the function membrane 40 is described below.

Figure 2:
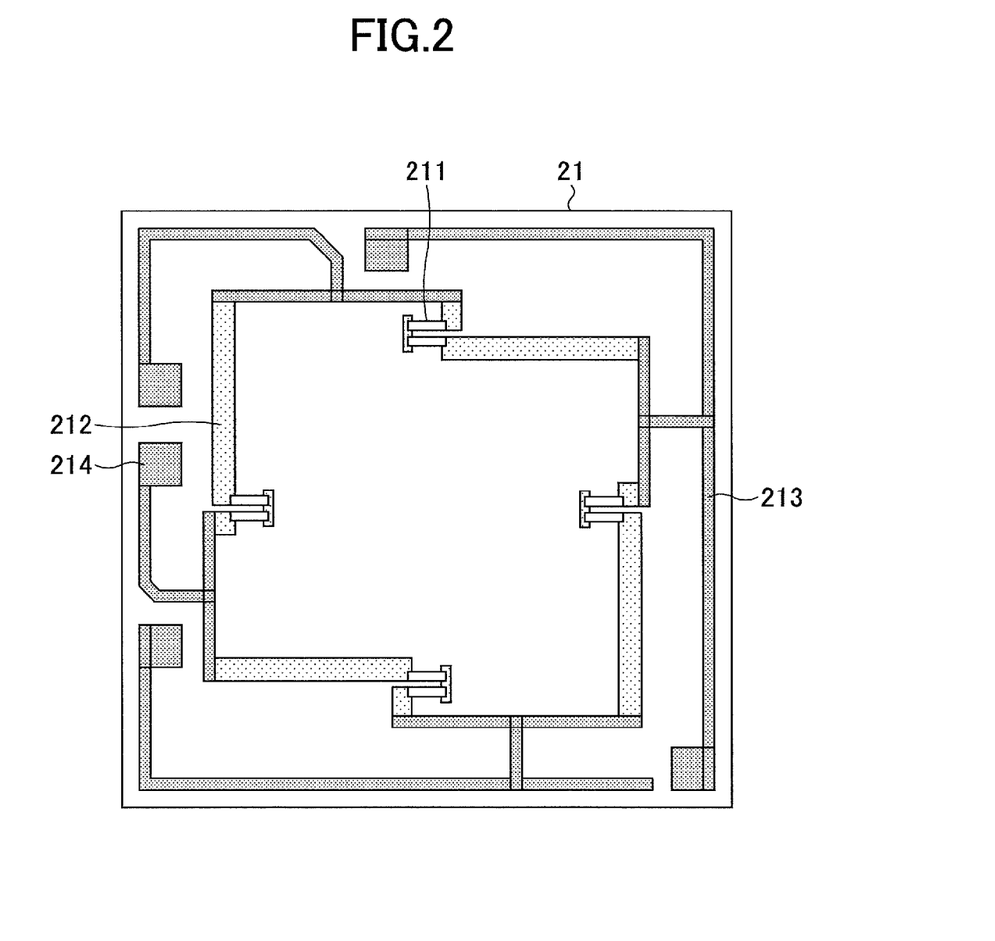
FIG. 2 is a plan view of a diaphragm surface of a physical quantity detection device according to the first embodiment.

FIG. 2 is a plan view of a diaphragm surface of a physical quantity detection device according to the first embodiment. Referring to FIG. 2, the diaphragm surface 21 includes piezoresistive elements 211, impurity resistance interconnects 212, metal interconnects 213, and pads 214. The piezoresistive elements 211 and the impurity resistance interconnects 212 form a Wheatstone bridge circuit and are configured to detect output voltage.

The piezoresistive elements 211 are one type of piezoelectric element, whose resistance values change depending on an applied pressure. Therefore, the Wheatstone bridge circuit using the piezoresistive elements 211 is configured to detect a pressure applied onto the diaphragm surface 21 by a variation in the output voltage. That is, a pressure applied to the diaphragm surface 21 is detected by a variation in the output voltage commensurate with a change in the resistance values of the piezoresistive elements 211.

Furthermore, the metal interconnects 213 are interconnects for forming the Wheatstone bridge circuit. The pads 214 are terminals or electrodes for external electrical connections. Power is externally supplied to the pads 214 to apply voltage to the Wheatstone bridge circuit, and a variation in the output voltage of the Wheatstone bridge circuit is detected from a change in the resistance values of the piezoresistive elements 211 due to the application of a pressure. Thus, a pressure applied to the diaphragm surface 21 is detected. For example, the physical quantity detection device 10 detects a pressure by having the diaphragm surface 21 configured as illustrated in FIG. 2.

Figure 3A:
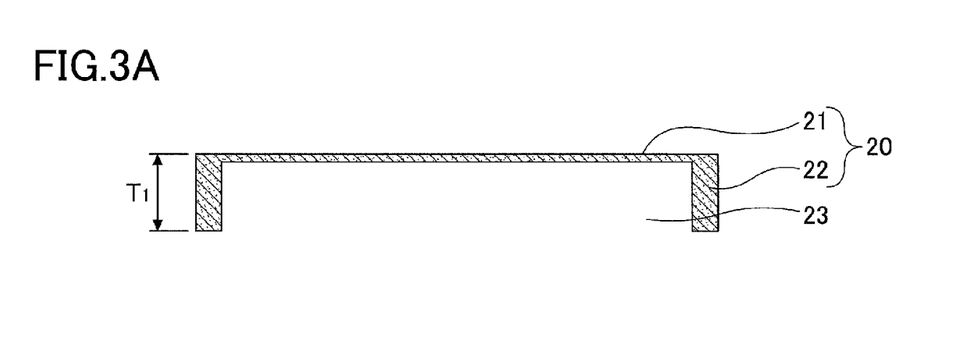
FIGS. 3A, 3B and 3C are diagrams illustrating a process for manufacturing a physical quantity detection device according to the first embodiment.
Figure 3B:
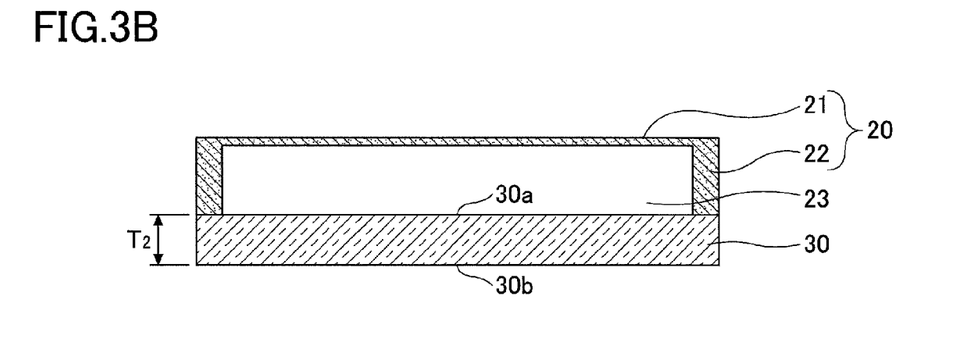
Figure 3C:
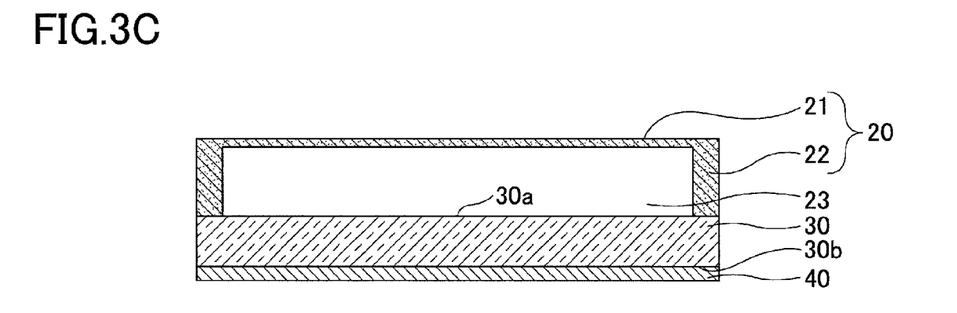

The physical quantity detection device 10 may be manufactured in the following manner, for example. In FIGS. 3A, 3B and 3C, a single physical quantity detection device is illustrated. In practice, however, multiple physical quantity detection devices are formed on a single wafer and are finally separated into individual physical quantity detection devices by dicing.

FIGS. 3A through 3C are diagrams illustrating a process for manufacturing a physical quantity detection device according to the first embodiment. First, at the process step illustrated in FIG. 3A, the diaphragm part 20 is formed. To be specific, for example, a substrate including silicon as a principal component, such as a silicon (Si) substrate or a SOI substrate, is prepared, and the diaphragm part 20 of a predetermined shape is formed by performing processing such as etching on the prepared substrate. A thickness $T_1$ of the diaphragm part 20 may be, for example, approximately 150 μm.

Next, at the process step illustrated in FIG. 3B, the diaphragm part 20 is fixed to the first surface 30a of the glass substrate 30 by anodic bonding. To be specific, the diaphragm part 20 and the glass substrate 30 are brought into contact in a high-temperature environment at a temperature (bond temperature) of, for example, approximately 300° C. to approximately 400° C. Then, a high voltage (bond voltage) of, for example, approximately 500 V to approximately 1500 V is applied across the diaphragm part 20 and the glass substrate 30 from a direct-current power supply with the diaphragm part 20 being at a higher potential than the glass substrate 30. As a result, the diaphragm part 20 is fixed to the first surface 30a of the glass substrate 30 by anodic bonding, so that the cavity part 23, which is a hermetically sealed space, is formed. A thickness $T_2$ of the glass substrate 30 may be, for example, approximately 100 μm.

Next, at the process step illustrated in FIG. 3C, the function membrane 40 is formed on the second surface 30b of the glass substrate 30. The function membrane 40 may be formed by depositing a Ti film on the second surface 30b of the glass substrate 30 by sputtering, for example. The thickness of the function membrane 40 may be, for example, approximately 100 nm. In place of the Ti film, any of the films described above as examples of the function membrane 40 may be formed. After the process step illustrated in FIG. 3C, individual physical quantity detection devices separated by dicing are formed.

The process step of forming the function membrane 40 is not limited in particular. For example, physical quantity detection devices may be separated by dicing before formation of the function membrane 40, and thereafter, the function membrane 40 may be formed on the second surface 30b of the glass substrate 30 of each individual physical quantity detection device. Alternatively, the function membrane 40 may be formed on the second surface 30b of the glass substrate 30 before anodic bonding at the process step illustrated in FIG. 3B. In this case, an area to be used as an electrode part in anodic bonding is exposed in part of the second surface 30b of the glass substrate 30.

Here, a description is given, with reference to the results of the experiments conducted by the inventors, of effects of forming the function membrane 40 on the second surface 30b of the glass substrate 30.

[Dependence of Output Variation on Thickness of Glass Substrate]

First, in the manner of the process steps illustrated in FIGS. 3A and 3B, multiple physical quantity detection devices in which the function membrane 40 was not formed on the second surface 30b of the glass substrate 30 were manufactured using the thickness of the glass substrate 30 as a parameter. To be specific, five physical quantity detection devices were manufactured with the thickness $T_1$ of the diaphragm part 20 being 1000 μm, the thickness $T_2$ of the glass substrate 30 being 1000 μm, and the bond temperature and bond voltage of anodic bonding being 400° C. and 600 V, respectively. Furthermore, apart from these physical quantity detection devices, nine physical quantity detection devices were manufactured with the thickness $T_1$ of the diaphragm part 20 being 150 μm, the thickness $T_2$ of the glass substrate 30 being 100 μm, and the bond temperature and bond voltage of anodic bonding being 400° C. and 600 V, respectively.

Next, after leaving each physical quantity detection device in a high-temperature, high-humidity condition (in an atmospheric environment of 85° C. and 85% Rh) for 100 hours, the temperature was returned to normal temperature and the output variation of each physical quantity detection device was measured by feeding an electric current to each physical quantity detection device. The measured output variation (hereinafter simply referred to as "post-test output variation") is a value obtained by converting a variation in the output voltage of the above-described Wheatstone bride circuit between before and after the test into a pressure (unit: Pa). The output voltage of the Wheatstone bride circuit before the test is a reference (zero).

According to the inventors, the condition for acceptable products is that the post-test output variation is within 100 Pa. This is because it is empirically known that the output variation of a physical quantity detection device falls within 150 Pa even after leaving the physical quantity detection device in a high-temperature, high-humidity condition (in an atmospheric environment of 85° C. and 85% Rh) for 1000 hours as long as this condition is satisfied and because no problem is caused in practical usage if the output variation is within 150 Pa. This condition, however, is a mere example, and may be changed to another condition depending on the use and/or design of the physical quantity detection device.

Figure 4A:
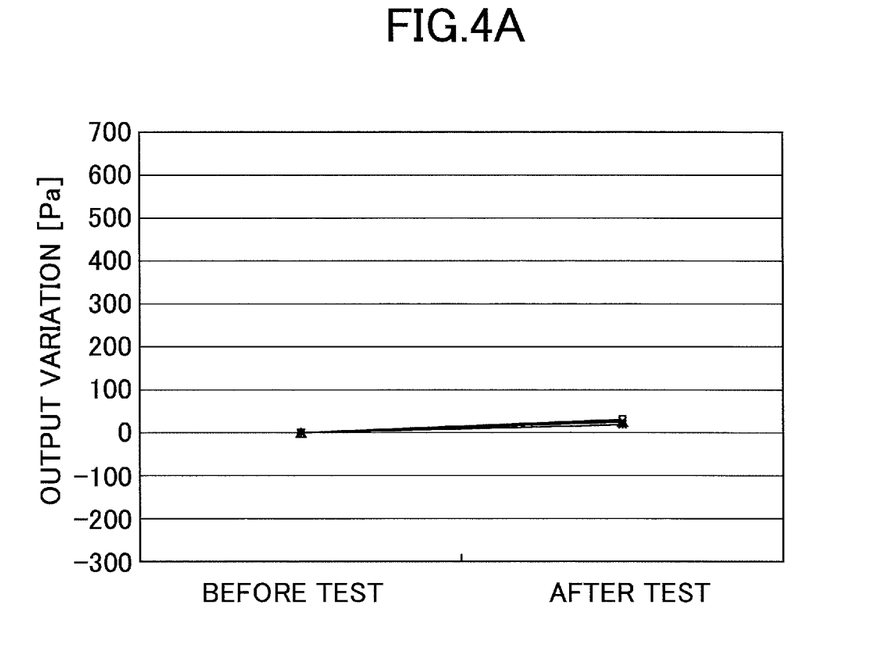
FIGS. 4A and 4B are graphs illustrating the dependence of the output variation of a physical quantity detection device on the thickness of a glass substrate.
Figure 4B:
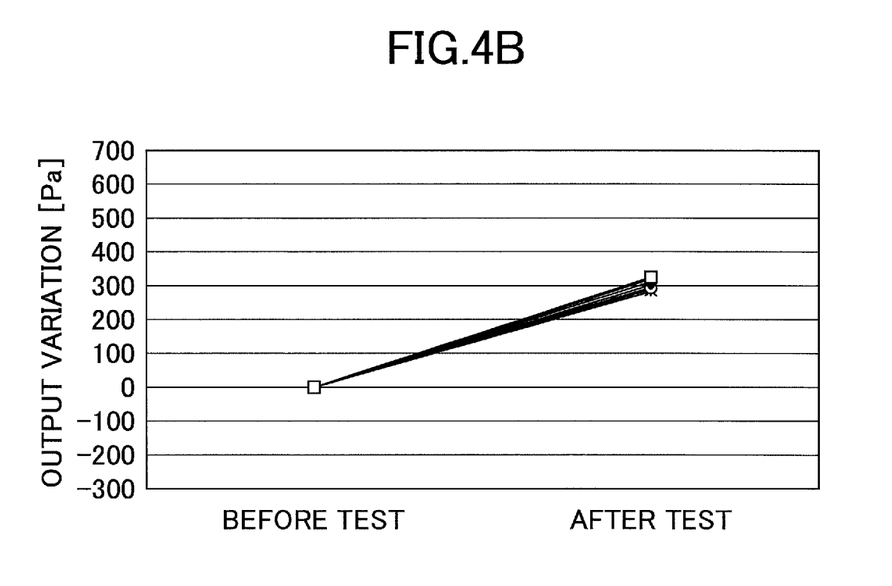

FIGS. 4A and 4B are graphs illustrating the dependence of the output variation of a physical quantity detection device on the thickness of a glass substrate. FIG. 4A illustrates the measurement results of the post-test output variation in the case where $T_1$=1000 μm and $T_2$=1000 μm. FIG. 4B illustrates the measurement results of the post-test output variation in the case where $T_1$=150 μm and $T_2$=100 μm.

It has been confirmed from FIG. 4A that with respect to the relatively thick physical quantity detection devices of $T_1$=1000 μm and $T_2$=1000 μm, the post-test output variation is within 100 Pa and the above-described condition for acceptable products is satisfied. On the other hand, it has been confirmed from FIG. 4B that with respect to the relatively thin physical quantity detection devices of $T_1$=150 μm and $T_2$=100 μm, the post-test output variation exceeds 100 Pa and the above-described condition for acceptable products is not satisfied.

Next, three physical quantity detection devices were manufactured with the thickness $T_1$ of the diaphragm part 20 being 150 μm, the thickness $T_2$ of the glass substrate 30 serving as a parameter, and the bond temperature and bond voltage of anodic bonding being 400° C. and 600 V, respectively, and the post-test output voltage was measured in the same manner as described above.

Figure 5:
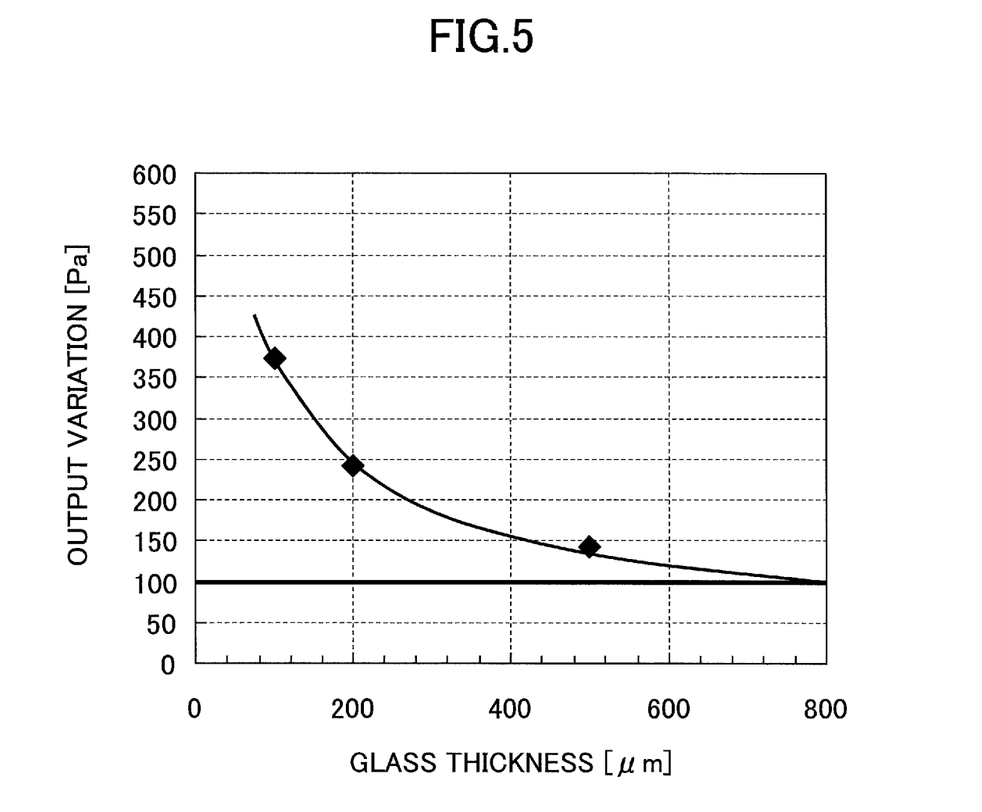
FIG. 5 is another graph illustrating the dependence of the output variation of a physical quantity detection device on the thickness of a glass substrate.

FIG. 5 is another graph illustrating the dependence of the output variation of a physical quantity detection device on the thickness of a glass substrate. It has been found from FIG. 5 that with respect to the relatively thin physical quantity detection devices of $T_1$=150 μm, the post-test output variation increases as the thickness $T_2$ of the glass substrate 30 decreases and the post-test output variation decreases as the thickness $T_2$ of the glass substrate 30 increases. Furthermore, it has been found from FIG. 5 that with respect to the relatively thin physical quantity detection devices of $T_1$=150 μm, the thickness $T_2$ of the glass substrate 30 needs to be more than 800 μm in order to satisfy the above-described condition for acceptable products.

[Dependence of Output Variation on Anodic Bonding Conditions]

At the above-described process step illustrated in FIG. 3B, multiple physical quantity detection devices where the function membrane 40 was not formed on the second surface 30b of the glass substrate 30 were formed using the bond temperature and bond voltage of anodic bonding as parameters. To be specific, multiple physical quantity detection devices were manufactured with the thickness $T_1$ of the diaphragm part 20 being 150 μm, the thickness $T_2$ of the glass substrate 30 being 100 μm, and the bond temperature and bond voltage of anodic bonding serving as parameters, and the post-test output voltage was measured in the same manner as described above.

Figure 6:
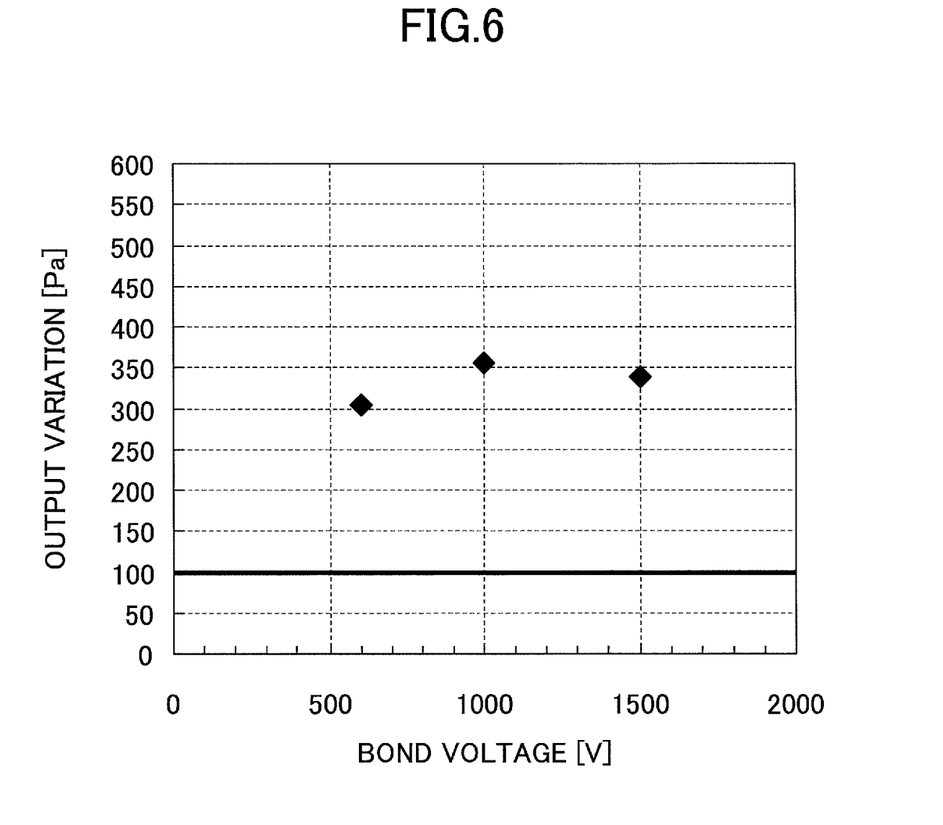
FIG. 6 is a graph illustrating the dependence of the output voltage of a physical quantity detection device on a bond voltage.

FIG. 6 is a graph illustrating the dependence of the output voltage of a physical quantity detection device on a bond voltage. The three physical quantity detection devices illustrated in FIG. 6 were manufactured with the bond temperature of anodic boding being 400° C. and the bond voltage of anodic bonding being 600 V, 1000 V, and 1500 V, respectively. It has been found from FIG. 6 that the relatively thin physical quantity detection devices of the thickness $T_1$ of the diaphragm part 20 being 150 μm and the thickness $T_2$ of the glass substrate 30 being 100 μm cannot satisfy the above-described condition for acceptable products even when the bond temperature of anodic bonding is controlled.

Figure 7:
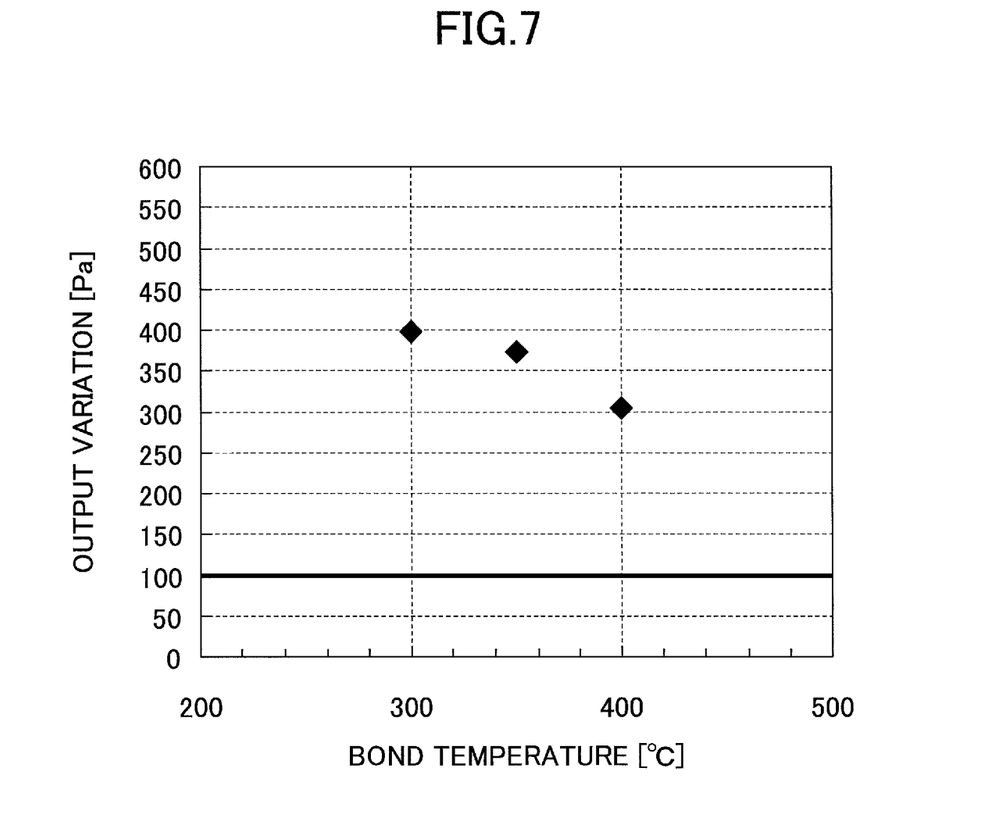
FIG. 7 is a graph illustrating the dependence of the output voltage of a physical quantity detection device on a bond temperature.

FIG. 7 is a graph illustrating the dependence of the output voltage of a physical quantity detection device on a bond temperature. The three physical quantity detection devices illustrated in FIG. 7 were manufactured with the bond voltage of anodic boding being 600 V and the bond temperature of anodic bonding being 300° C., 350° C., and 400° C., respectively. It has been found from FIG. 7 that the relatively thin physical quantity detection devices of the thickness $T_1$ of the diaphragm part 20 being 150 μm and the thickness $T_2$ of the glass substrate 30 being 100 μm cannot satisfy the above-described condition for acceptable products even when the bond voltage of anodic bonding is controlled.

[Study of Function Membrane]

Next, multiple physical quantity detection devices having the function membrane 40 formed on the second surface 30b of the glass substrate 30 were manufactured in the manner of the process steps illustrated in FIGS. 3A through 3C. To be specific, the diaphragm part 20 and the glass substrate 30 were bonded by anodic bonding with the thickness $T_1$ of the diaphragm part 20 being 150 μm, the thickness $T_2$ of the glass substrate 30 being 100 μm, and the bond temperature and bond voltage of anodic bonding being 400° C. and 600 V, respectively. Then, four physical quantity detection devices were manufactured by depositing the function membrane 40 on the second surface 30b of the glass substrate 30.

In the four physical quantity detection devices, a Ti film of 100 nm in thickness, a Au film of 150 nm in thickness, a SiN film of 100 nm in thickness, and a silicon oxide ($SiO_2$) film of 100 nm in thickness were deposited, respectively, as the function membrane 40. In the formation of the Au film, a TiW film of 35 nm in thickness was deposited as an underlayer.

The Ti film, the Au film, and the underlayer TiW film were deposited by sputtering. Furthermore, the SiN film and the $SiO_2$ film were deposited by plasma chemical vapor deposition (CVD).

Figure 8:
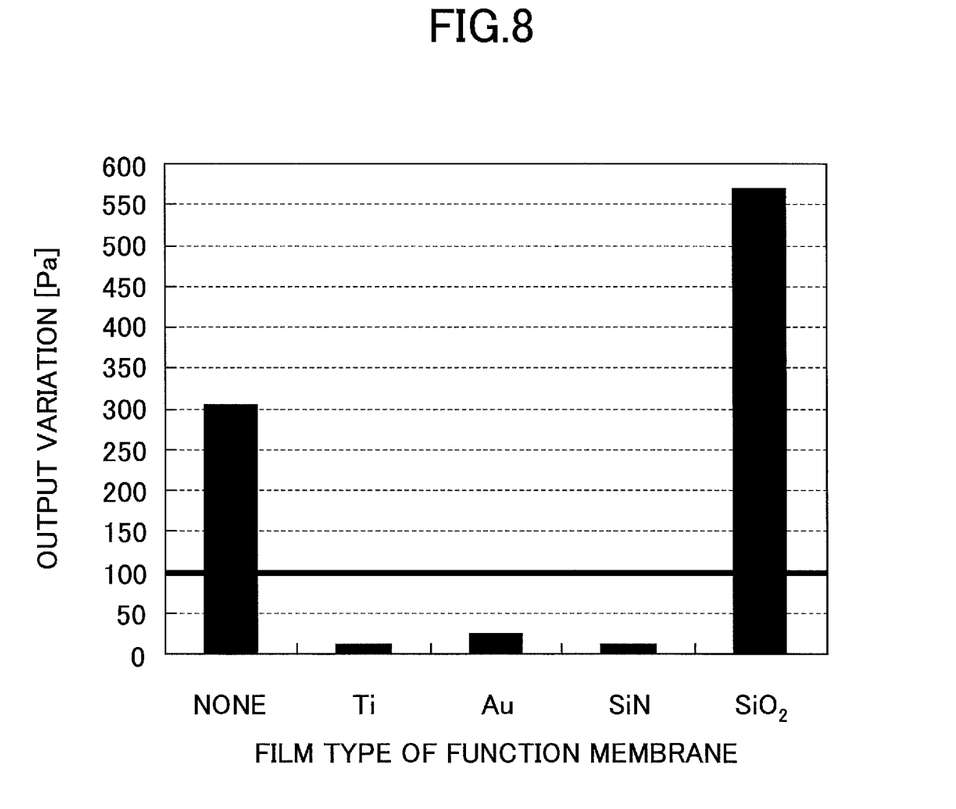
FIG. 8 is a graph illustrating the dependence of the output variation of a physical quantity detection device on the film type of a function membrane.

FIG. 8 is a graph illustrating the dependence of the output variation of a physical quantity detection device on the film type of a function membrane. FIG. 8 also illustrates data on a physical quantity detection device having no function membrane (indicated by "NONE") for comparison purposes. It has been found from FIG. 8 that the relatively thin physical quantity detection devices of the thickness $T_1$ of the diaphragm part 20 being 150 μm and the thickness $T_2$ of the glass substrate 30 being 100 μm can satisfy the above-described condition for acceptable products by selecting a proper film type and depositing the function membrane 40 on the second surface 30b of the glass substrate 30.

[Summary]

The above-described experimental results are summarized as follows. When the thickness $T_2$ of the glass substrate 30 is more than 800 μm, it is possible to satisfy the above-described condition for acceptable products irrespective of the presence or absence of a function membrane. (See FIG. 5.) However, when the thickness $T_2$ of the glass substrate 30 is reduced (to 800 μm or less) in order to satisfy a commercial demand for thinner physical quantity detection devices, it is not possible to satisfy the above-described condition for acceptable products. (See FIG. 5.) Furthermore, this result is not improved by changing anodic bonding conditions (a bond temperature and a bond voltage). (See FIG. 6 and FIG. 7.)

On the other hand, when the function membrane 40 is formed on the second surface 30b of the glass substrate 30, it is possible to significantly reduce the output variation compared with the case of not forming the function membrane 40 and to satisfy the above-described condition for acceptable products, depending on the film type of the function membrane 40. (See FIG. 8.) That is, the film type of the function membrane 40 is selected from those having a disposition to repel moisture and also a disposition to prevent the migration of alkali metal ions (such as $Na^+$ and $K^+$). As a result, even when the thickness $T_2$ of the glass substrate 30 is reduced (to 800 μm or less), it is possible to significantly reduce the output variation and thus to satisfy the above-described condition for acceptable products.

Here, an explanation is given of the reason the formation of the function membrane 40 on the second surface 30b of the glass substrate 30 makes it possible to significantly reduce the output variation even when the thickness $T_2$ of the glass substrate 30 is reduced (to 800 μm or less).

In anodic bonding, alkali glass is commonly used in principle. The components of alkali glass include alkali metals such as Na and K. At a surface of the glass, the following reaction occurs between alkali metal ions such as sodium ions ($Na^+$) and potassium ions ($K^+$) in the glass and $H_2O$ in the atmosphere. The reaction illustrated below is about sodium ions ($Na^+$), but the same reaction also occurs with respect to potassium ions ($K^+$).

$$Na^+(\text{glass}) + H_2O(\text{in the atmosphere}) \rightarrow NaOH + H^+(\text{into glass}). \quad (1)$$

This reaction is more likely to occur at higher humidity and higher temperature. Furthermore, silicates, which are principal components of glass, hardly dissolve in acids (except a hydrofluoric acid). Silicates, however, have poor resistance to alkalis, and dissolve in alkaline solutions having a pH greater than or equal to 9.8. Therefore, it is believed that generated NaOH further captures moisture in the atmosphere to become an alkaline solution so that glass is dissolved to be apparently reduced in thickness, thus disrupting stress balance to cause a characteristic variation.

In the case of a large glass thickness (for example, 1000 μm), it is understood that the characteristic variation was limited as illustrated in FIG. 4A because a layer of dissolved glass is relatively limited and the stress balance of the physical quantity detection device hardly changes. On the other hand, in the case of a small glass thickness (for example, 100 μm), it is understood that the characteristic variation was conspicuous as illustrated in FIG. 4B because a layer of dissolved glass is relatively large and the stress balance of the physical quantity detection device changes.

In anodic bonding, it is known that whitish powder (deposit) whose component is Na adheres to a bottom surface of glass in principle, and this component may become an alkaline solution. Therefore, the inventors evaluated samples having glass polished after anodic bonding in the same manner, but found no improvement. From this result, it is clear that the output variation is not caused by a deposit and it is understood that the output variation is caused by the reaction at the glass surface as described above.

Furthermore, depending on the film type of the function membrane 40, formation of the function membrane 40 does not reduce the output variation. To be specific, the output variation is not reduced by forming a $SiO_2$ film as the function membrane 40 as illustrated in FIG. 8. The reason the formation of a $SiO_2$ film as the function membrane 40 had no effect is that alkali metal ions such as $N^+$ and $K^+$ are allowed to move inside $SiO_2$, which is also a principal component of alkali glass.

That is, alkali metal ions such as $N^+$ and $K^+$ are mobile ions and migrate to minimize the energy state inside glass. Therefore, it is understood that alkali metal ions such as $N^+$ and $K^+$ migrate through the $SiO_2$ film to react $H_2O$ in the atmosphere, thus making the formation of the $SiO_2$ film ineffective.

Thus, according to the first embodiment, in the physical quantity detection device 10 including the diaphragm part 20 and the glass substrate 30, the function membrane 40 that prevents alkali metal ions included in the glass substrate 30 from coming into contact with moisture in the atmosphere is formed on the second surface 30b of the glass substrate 30. As a result, even when the glass substrate 30 is reduced in thickness (to 800 μm or less), the function membrane 40 prevents alkali metal ions in the glass substrate 30 and moisture in the atmosphere from reacting and generating an alkaline solution to dissolve the second surface 30b of the glass substrate 30. Consequently, it is possible to satisfy a predetermined specification (the above-described condition for acceptable products) with respect to the output variation of the physical quantity detection device 10.

In the case of reducing the thickness of the physical quantity detection device 10, while neither the thickness of a silicon substrate nor the thickness of a glass substrate is preferred in their size relationship, it is difficult to make the silicon substrate thinner than 150 μm. Accordingly, in the case of particularly reducing the thickness of the physical quantity detection device 10, the thickness of the glass substrate may be made smaller than or equal to the thickness of the glass substrate. In such a case, formation of the function membrane 40 is particularly effective as a measure to reduce the output variation of the physical quantity detection device 10. This, however, does not limit the invention to making the thickness of the glass substrate smaller than or equal to the thickness of the silicon substrate.

In the case of providing the physical quantity detection device 10 in absolute pressure sensors, the cavity part 23 is maintained in a vacuum state and does not come into contact with the atmosphere. Accordingly, there is no need to form a function membrane on the first surface 30a of the glass substrate 30.

[First Variation of First Embodiment]

In a first variation of the first embodiment, a physical quantity detection device having a structure different from that of the first embodiment is illustrated. In the first variation of the first embodiment, a description of the same elements as those of the embodiment described above is omitted.

Figure 9:
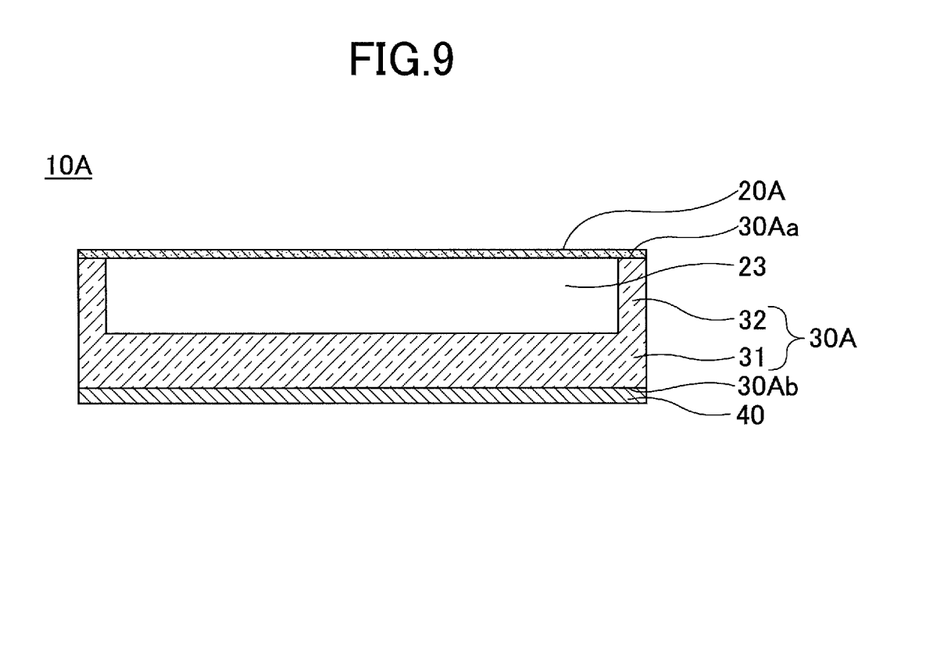
FIG. 9 is a cross-sectional view of a physical quantity detection device according to a first variation of the first embodiment.

FIG. 9 is a cross-sectional view of a physical quantity detection device according to the first variation of the first embodiment. Referring to FIG. 9, a physical quantity detection device 10A according to the first variation of the first embodiment includes a diaphragm part 20A, a glass substrate 30A, and the function membrane 40. The physical quantity detection device 10A may be provided in, for example, absolute pressure sensors.

Unlike the diaphragm part 20 (FIG. 1) of the physical quantity detection device 10, the diaphragm part 20A (a pressure-sensitive diaphragm part), which is a physical quantity detection part, has a flat plate shape. The diaphragm part 20A operates the same as the diaphragm part 20. Like the diaphragm part 20, the diaphragm part 20A is formed in, for example, a Si substrate. Thus, a silicon substrate or the like that is entirely reduced in thickness to the thickness of a diaphragm may be used as the diaphragm part 20A.

The glass substrate 30A has a monolithic structure and includes a flat plate part 31 and a frame part 32. The frame part 32 is annularly formed on an outer edge portion of the flat plate part 31 to vertically extend from the flat plate part 31. The glass substrate 30A is a support member that supports the diaphragm part 20A. For example, an outer edge portion of a bottom surface of the diaphragm part 20A is fixed to an upper surface of the frame part 32, which is a first surface 30Aa (a top surface in FIG. 9) of the glass substrate 30A, by anodic bonding. The diaphragm part 20A is bonded to the first surface 30Aa of the glass substrate 30A, so that the cavity part 23, which is a hermetically sealed space, is formed.

The function membrane 40 is formed so as to cover a bottom surface of the flat plate part 31, which is a second surface 30Ab (a bottom surface on the side opposite to the first surface 30Aa in FIG. 9) of the glass substrate 30A. The details of the function membrane 40 are as described above in the first embodiment.

Thus, in the first variation of the first embodiment as well, the function membrane 40 is formed so as to cover the second surface 30Ab. Therefore, the same effects as in the first embodiment are produced.

[Second Variation of First Embodiment]

In a second variation of the first embodiment, another physical quantity detection device having a structure different from that of the first embodiment is illustrated. In the second variation of the first embodiment, a description of the same elements as those of the embodiment and variation described above is omitted.

Figure 10:
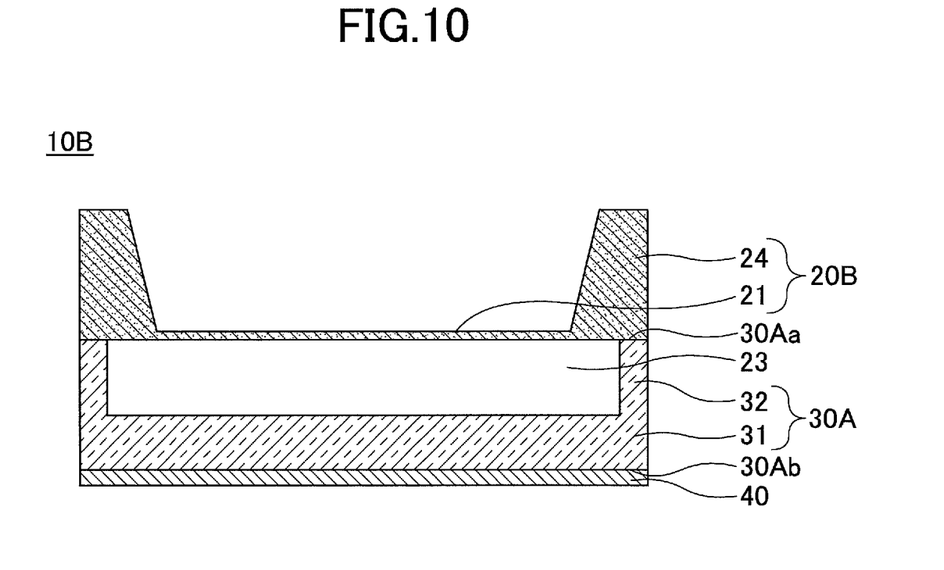
FIG. 10 is a cross-sectional view of a physical quantity detection device according to a second variation of the first embodiment.

FIG. 10 is a cross-sectional view of a physical quantity detection device according to the second variation of the first embodiment. Referring to FIG. 10, a physical quantity detection device 10B according to the second variation of the first embodiment is different from the physical quantity detection device 10A according to the first variation of the first embodiment (FIG. 9) in that the diaphragm part 20A is replaced with a diaphragm part 20B. The physical quantity detection device 10B may be provided in, for example, absolute pressure sensors.

Unlike the diaphragm part 20A (FIG. 9) of the physical quantity detection device 10A, the diaphragm part 20B (a pressure-sensitive diaphragm part), which is a physical quantity detection part, has a frame-shaped projecting part 24 provided on an outer edge portion of the flat plate so as to project in a direction away from the glass substrate 30A. The diaphragm part 20B operates the same as the diaphragm part 20A. Like the diaphragm part 20A, the diaphragm part 20B is formed in, for example, a Si substrate. Thus, a silicon substrate or the like that is partly (that is, in a part other than the projecting part 24) reduced in thickness to the thickness of a diaphragm may be used as the diaphragm part 20B.

Thus, in the second variation of the first embodiment as well, the function membrane 40 is formed so as to cover the second surface 30Ab. Therefore, the same effects as in the first embodiment are produced.

[Third Variation of First Embodiment]

In a third variation of the first embodiment, yet another physical quantity detection device having a structure different from that of the first embodiment is illustrated. In the third variation of the first embodiment, a description of the same elements as those of the embodiment and variations described above is omitted.

Figure 11A:
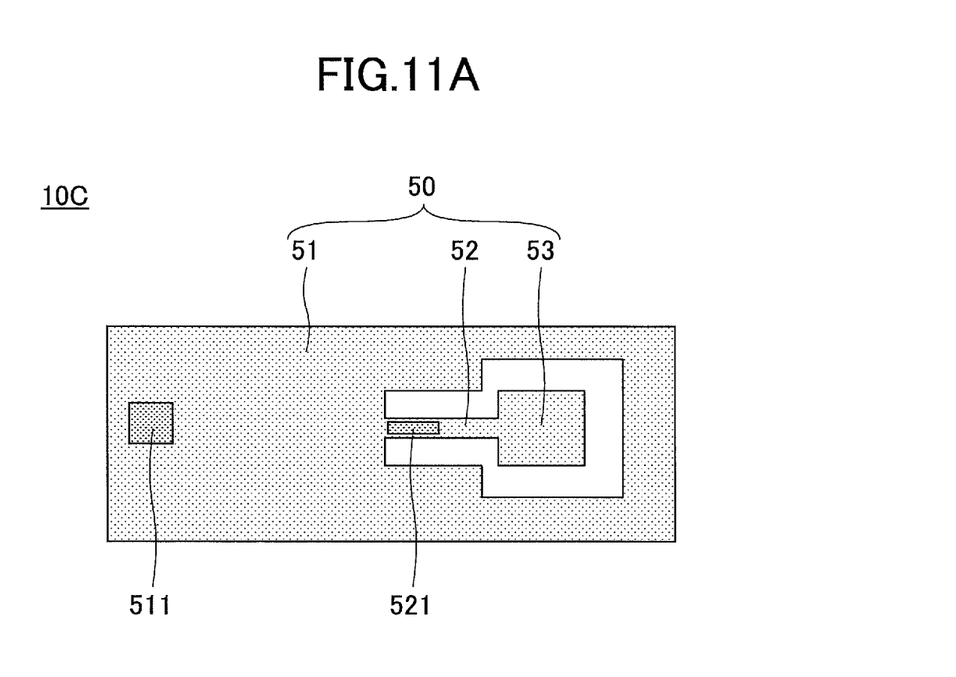
FIGS. 11A and 11B are diagrams illustrating a physical quantity detection device according to a third variation of the first embodiment.
Figure 11B:
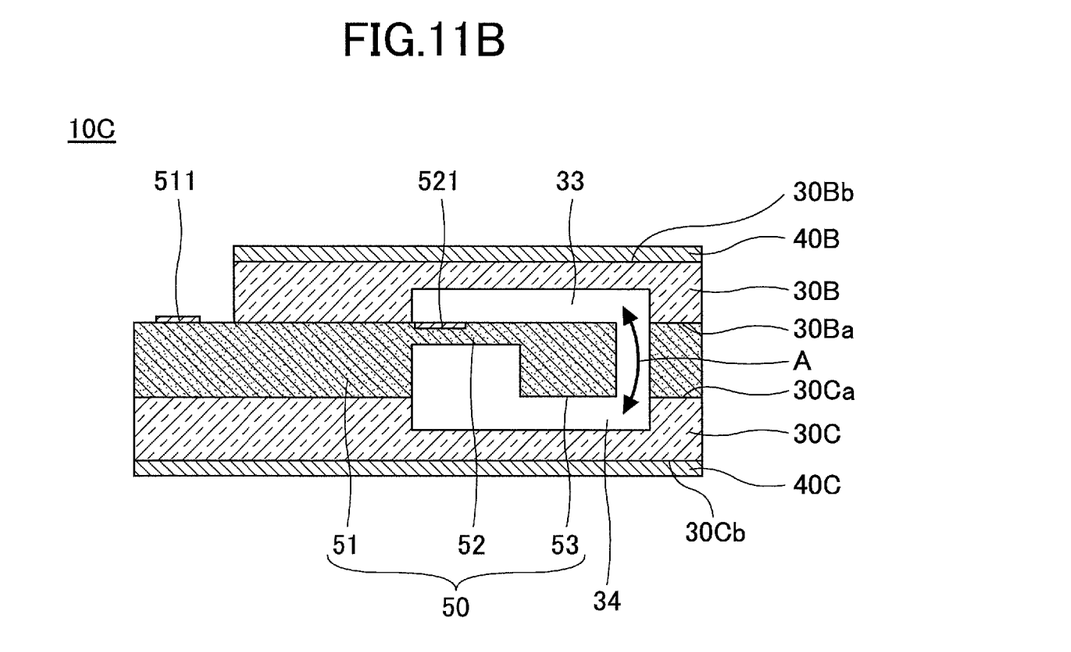

FIGS. 11A and 11B are diagrams illustrating a physical quantity detection device according to the third variation of the first embodiment. FIGS. 11A and 11B are a plan view and a cross-sectional view, respectively, of a physical quantity detection device according to the third variation of the first embodiment. In FIG. 11A, however, a below-described substrate 50 (including a pad 511 and a piezoresistive element 521) alone is illustrated.

Referring to FIGS. 11A and 11B, a physical quantity detection device 10C according to the third variation of the first embodiment includes glass substrates 30B and 30C, function membranes 40B and 40C, and the substrate 50. The physical quantity detection device 100 may be provided in, for example, acceleration sensors.

The substrate 50 includes a frame part 51, a beam part 52, and a weight part 53. The beam part 52 supports the weight part 53. One end of the beam part 52 is connected to the frame part 51. The weight part 53 is formed at another end of the beam part 52. The beam part 52 and the weight part 53 serve as a physical quantity detection part, and are configured to be rotatable in directions indicated by a double-headed arrow A in FIG. 11B (substantially vertical directions) relative to the frame part 51. For example, a Si substrate may be used as the substrate 50. In this case, the frame part 51, the beam part 52, and the weight part 53 may be formed of silicon as a monolithic structure.

A first surface 30Ba (a bottom surface in FIG. 11B) of the glass substrate 30B including a cavity part 33 is bonded to an upper surface of the frame part 51 of the substrate 50. Furthermore, a first surface 30Ca (a top surface in FIG. 11B) of the glass substrate 30C including a cavity part 34 is bonded to a lower surface of the frame part 51 of the substrate 50. When the substrate 50 is made of silicon, the substrate 50 and the glass substrates 30B and 30C may be fixed by, for example, anodic bonding. The cavity parts 33 and 34 communicate with each other to form a hermetically sealed space. The beam part 52 and the weight part 53, which serve as a physical quantity detection part, are disposed in the hermetically sealed space.

A cavity space, however, may be formed in either the glass substrate 30B or the glass substrate 30C alone. In that case, the beam part 52 and the weight part 53 may be formed at such a position where a gap is formed between the glass substrates 30B and 30C.

The piezoresistive element 521 is formed on the beam part 52. The weight part 53 is caused to rotate in either direction indicated by the arrow A (substantially vertical direction) by the application of acceleration, and the beam part 52 supporting the weight part 53 also is caused to deflect upward or downward by the movement of the weight part 53. The resistance value of the piezoresistive element 521 on the beam part 52 is caused to change by the deflection of the beam part 52, and the acceleration is detected by detecting this change in the resistance value.

The pad 511, which is formed of aluminum or the like, is formed outside the glass substrate 30B on the upper surface of the frame part 51. The pad 511 is electrically connected to the piezoresistive element 521 by diffusion wiring (not illustrated) or the like. By connecting the pad 511 with an external integrated circuit (IC) or the like, an acceleration sensor using the physical quantity detection device 100 may be achieved.

The function membrane 40B is formed so as to cover a second surface 30Bb (a top surface on the side opposite to the first surface 30Ba in FIG. 11B) of the glass substrate 30B. The function membrane 40C is formed so as to cover a second surface 30Cb (a bottom surface on the side opposite to the first surface 30Ca in FIG. 11B) of the glass substrate 30C. The function and material of the function membranes 40B and 40C are the same as those of the function membrane 40 illustrated in the first embodiment, and their description is therefore omitted.

Thus, in the third variation of the first embodiment as well, the function membranes 40B and 40C are formed so as to cover the second surfaces 30Bb and 30Cb of the glass substrates 30B and 30C, respectively. Therefore, the same effects as in the first embodiment are produced.

Second Embodiment

In a second embodiment, a physical quantity detector (a semiconductor sensor) including the physical quantity detection device 10 according to the first embodiment is illustrated. In the second embodiment, a description of the same elements as those of the embodiment described above is omitted. In the second embodiment, the physical quantity detection device 10 may be replaced with the above-described physical quantity detection device 10A, 10B or 10C.

Figure 12:
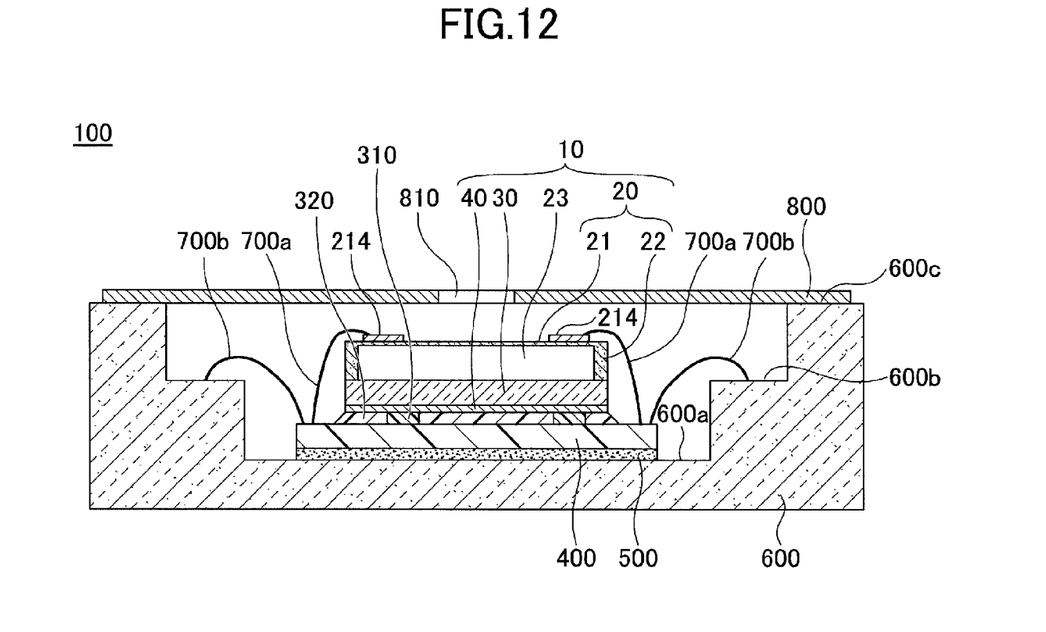
FIG. 12 is a cross-sectional view of a physical quantity detector according to a second embodiment.

FIG. 12 is a cross-sectional view of a physical quantity detector according to the second embodiment. Referring to FIG. 12, a physical quantity detector 100 according to the second embodiment includes the physical quantity detection device 10, a substrate 400, adhesive resin 500, a substrate 600, bonding wires 700a and 700b, and a lid 800.

To be more specific, the physical quantity detector 100 has the following structure. That is, the substrate 600 is stepped to include three-level surfaces. The substrate 400 is bonded onto a lower-level surface 600a of the substrate 600 by the adhesive resin 500. A control IC may be mounted on the substrate 400.

The physical quantity detection device 10 is provided over the substrate 400 with a resist spacer 310 interposed between the physical quantity detection device 10 and the substrate 400. The substrate 400 and the physical quantity detection device 10 are bonded by adhesive resin 320 filling in a space around the resist spacer 310 between the substrate 400 and the physical quantity detection device 10.

The resist spacer 310 is formed by patterning a resist and serves as a base for placing the physical quantity detection device 10. Furthermore, the resist spacer 310 serves to prevent deformation of the adhesive resin 320 when a pressure is applied at the time of bonding the bonding wires 700. The thickness of the resist spacer 310 may be, for example, approximately 20 μm to approximately 30 μm.

Pads 214 are provided on the diaphragm surface 21 of the physical quantity detection device 10, and pads (not illustrated) are also provided on the substrate 400 as wiring terminals. The pads 214 of the physical quantity detection device 10 and the pads (not illustrated) of the substrate 400 are electrically connected by the bonding wires 700a.

Furthermore, pads (not illustrated) are also provided on a middle-level surface 600b of the substrate 600 as wiring terminals. The pads of the substrate 400 and the pads of the substrate 600 are electrically connected by the bonding wires 700b. The lid 800 is provided on an upper-level surface 600c of the substrate 600 so as to cover the physical quantity detection device 10. Furthermore, a through hole 810 is provided in the center of the lid 800 so as to allow the diaphragm surface 21 to sense an external pressure.

The physical quantity detection device 10 is a device for detecting a predetermined physical quantity, and detects an absolute pressure in the physical quantity detector 100. Here, the absolute pressure is a pressure relative to a perfect vacuum (or an absolute vacuum). Therefore, the cavity part 23 of the physical quantity detection device 10 is made a vacuum reference chamber maintained in a vacuum state.

Thus, the physical quantity detector 100 that detects an absolute pressure may be achieved using the physical quantity detection device 10. Furthermore, the physical quantity detection device 10 may be used for, in addition to semiconductor sensors that detect an absolute pressure, gauge pressure sensors, flow sensors, acceleration sensors, gyroscope sensors, laser oscillators, optical switches, displays, optical sensors, prober ring heads, IR sensors, μ-TAS (Micro Total Analysis Systems), inkjet heads, micro motors, RF switches, etc.

All examples and conditional language provided herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

What is claimed is:

1. A physical quantity detection device, comprising:
   a glass substrate;
   a substrate including a physical quantity detection part, the substrate being bonded to a first surface of the glass substrate with a hermetically sealed space being formed inside the substrate; and
   a function membrane formed on a second surface of the glass substrate opposite to the first surface, the function membrane preventing the second surface of the glass substrate from coming into contact with moisture in an atmosphere.

2. The physical quantity detection device as claimed in claim 1, wherein the function membrane has a disposition to repel moisture so as to prevent alkali metal ions in the glass substrate from coming into contact with the moisture in the atmosphere and a disposition to prevent the alkali metal ions from migrating through the glass substrate.

3. The physical quantity detection device as claimed in claim 1, wherein the function membrane is formed of a film comprising one of gold, titanium and a silicon nitride.

4. The physical quantity detection device as claimed in claim 1, wherein a thickness of the glass substrate is less than or equal to a thickness of the substrate.

5. The physical quantity detection device as claimed in claim 1, wherein a thickness of the glass substrate is less than or equal to 800 μm.

6. The physical quantity detection device as claimed in claim 1, wherein the substrate is formed of silicon.

7. A physical quantity detector, comprising:
   the physical quantity detection device as set forth in claim 1.

8. The physical quantity detector as claimed in claim 7, wherein the physical quantity detection device is fixed onto another substrate by adhesive resin with the function membrane facing toward said another substrate.

9. A physical quantity detection device, comprising:
   a first glass substrate and a second glass substrate, wherein at least one of the first and second glass substrates includes a cavity;
   a substrate including a physical quantity detection part, the substrate being bonded to and provided between the first and second glass substrates with a hermetically sealed space formed around the physical quantity detection part; and
   a first function membrane and a second function membrane formed on a surface of the first glass substrate facing away from the substrate and a surface of the second glass substrate facing away from the substrate, respectively, wherein the first and second function membranes preventing the surfaces of the first and second glass substrates from coming into contact with moisture in an atmosphere.

10. The physical quantity detection device as claimed in claim 9, wherein the first and second function membranes have a disposition to repel moisture so as to prevent alkali metal ions in the first and second glass substrates from coming into contact with the moisture in the atmosphere and a disposition to prevent the alkali metal ions from migrating through the first and second glass substrates.

11. The physical quantity detection device as claimed in claim 9, wherein each of the first and second function membranes is formed of a film comprising one of gold, titanium and a silicon nitride.

12. The physical quantity detection device as claimed in claim 9, wherein a thickness of each of the first and second glass substrates is less than or equal to a thickness of the substrate.

13. The physical quantity detection device as claimed in claim 9, wherein a thickness of each of the first and second glass substrates is less than or equal to 800 μm.

14. The physical quantity detection device as claimed in claim 9, wherein the substrate is formed of silicon.

15. A physical quantity detector, comprising:
   the physical quantity detection device as set forth in claim 9.

16. The physical quantity detector as claimed in claim 15, wherein the physical quantity detection device is fixed onto another substrate by adhesive resin with one of the first and second function membranes facing toward said another substrate.

* * * * *